Aug. 7, 1951 L. D. SMULLIN ET AL 2,562,958

MICROWAVE FREQUENCY STABILIZER

Filed April 8, 1948

INVENTORS
LOUIS D. SMULLIN
JAMES BROWN HOMER KUPER
BY
R. P. Morris
ATTORNEY

Patented Aug. 7, 1951

2,562,958

UNITED STATES PATENT OFFICE 2,562,958

MICROWAVE FREQUENCY STABILIZER

Louis D. Smullin, Nutley, N. J., and James Brown Homer Kuper, Bayport, N. Y., assignors to Federal Telephone and Radio Corporation, New York, N. Y., a corporation of Delaware Application April 8, 1948, Serial No. 19,688

3 Claims. (Cl. 250—36)

This invention relates to microwave or ultra-high-frequency oscillators, and more particularly it relates to the frequency stabilization of such oscillators.

A principal object of the invention is to improve the performance of microwave oscillators having a frequency-stabilizing arrangement of the so-called "Magic T" type.

A feature of the invention relates to a microwave oscillator stabilizing system employing a frequency-sensitive arrangement having a pair of crystal detectors which are respectively coupled to the oscillator by respective "Magic T" wave guides, and means are provided in the said "T" sections to avoid the undesirable effects of reflection from the crystals therein.

Another feature relates to a microwave oscillator stabilizing system employing a so-called "Magic T" frequency discriminator, together with special attenuation matching pads for the crystals in each "T" section to prevent erratic "locking-in" of the oscillator at an undesired frequency, and to insure the maintenance of symmetrical frequency discriminator characteristic curves.

The above-mentioned and other features and objects of this invention and the manner of attaining them will become more apparent and the invention itself will be best understood, by reference to the following description of an embodiment of the invention taken in conjunction with the accompanying drawings, wherein.

The microwave generator according to the present invention comprises any well-known microwave oscillator whose frequency can be controlled by the magnitude of a D. C. control signal, which in turn is determined by the coaction of a double "Magic T" frequency-sensitive arrangement of the wave guide type. A complete description of the operation of the "Magic T" coupler may be obtained in Radiation Laboratory Report 662 entitled "Microwave Frequency Discriminator."

Figure 1:
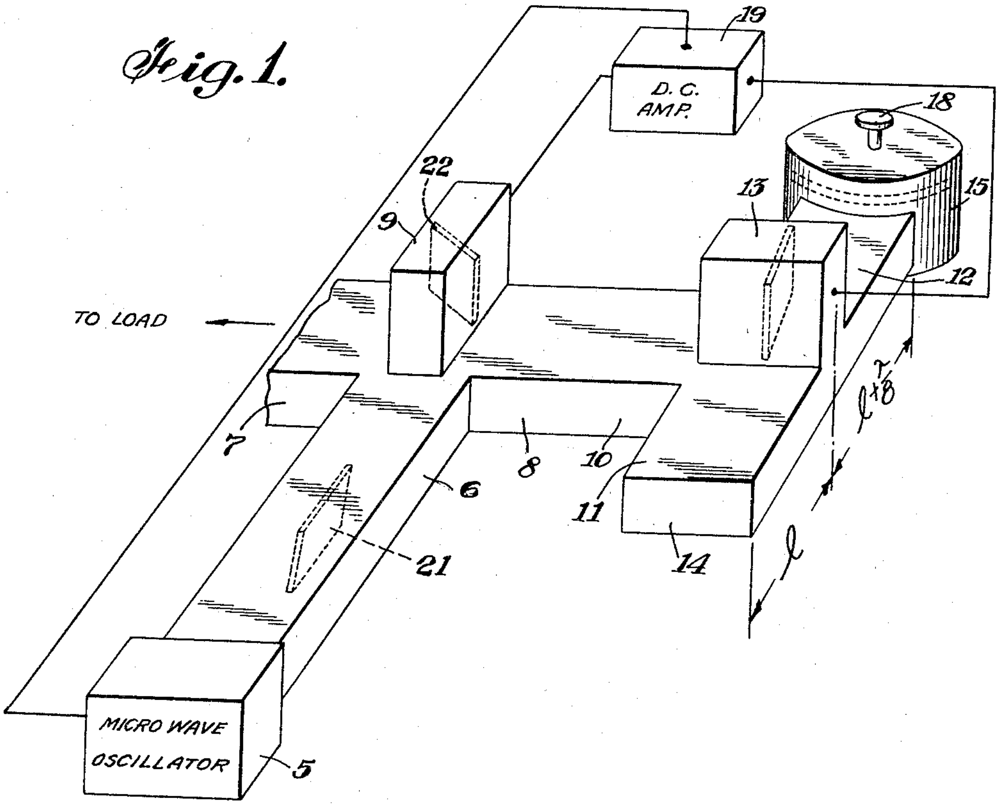
Fig. 1 is a composite structural and schematic wiring diagram, partly isometric, of a microwave oscillator system according to the invention.

When such a "Magic T" is used as a frequency discriminator, it is used as a bridge to compare the reflections from a short-circuited stub wave guide, with that of a resonator such as an adjustable cavity resonator located at the end of another line which is an odd number of eight wave lengths long. An exposition of the general principles of the frequency discriminator will also be found in Radiation Laboratory Report 662 entitled "Microwave Frequency Discriminator." Thus as shown in Fig. 1, the waves from the microwave oscillator 5 are coupled into a "Magic T" comprising input arm 6, lateral arms 7 and 8, and opposite arm 9, so that one-half the wave energy travels towards the right and enters another "Magic T" comprised of input arm 10, lateral arms 11 and 12, and opposite arm 13. The arm 11 is short-circuited at the end 14, while the arm 12 is terminated in the tunable high "Q" cavity resonator 15. Crystal detectors 16, 17, are located respectively in arms 9 and 13, and they are preferably of the silicon point-contact rectifier type.

It will be assumed that the oscillator 5 is required to generate at a stabilized frequency F, and therefore the cavity 15 is tuned by knob 18 to resonate at this frequency. The arm 11 is of a length $l$, and the arm 12 is $l+\lambda/8$ where $\lambda$ is the wave length of the waves. Consequently for excitation frequencies far above or below the said resonant frequency, the cavity 15 appears as a short circuit, and the reflected waves are shifted by $\pi/2$ in phase relative to one another as they reconverge on the "T" junction 10—11—12.

On the other hand, in the vicinity of resonance the cavity 15 gives rise to a reflection in the same or opposite phase to the reflection from end 14, so that at resonance, waves again are impressed on the "T" junction 10—11—12.

The operation of the discriminator will be apparent from a study of Radiation Laboratory Report 662, loc. cit.

In order to achieve the desired symmetry of operation, it is necessary in tuning-up, to adjust the outputs of the detectors 16, 17. However, we have found that with the double-"T" arrangement shown in Figs. 1 and 2, difficulties are often encountered, amongst which may be mentioned erratic "locking-in" of oscillator 5 at some undesired frequency. While it is always possible to obtain some stabilization of oscillator 5, as long as there is a region in which the voltage output of amplifier 19 changes rapidly in the required direction with change of frequency, unless the discriminator curve is symmetrical and unless there is a definite ratio between the currents from the crystals 16 and 17, it is difficult to prescribe a tuning-up procedure.

Figure 2:
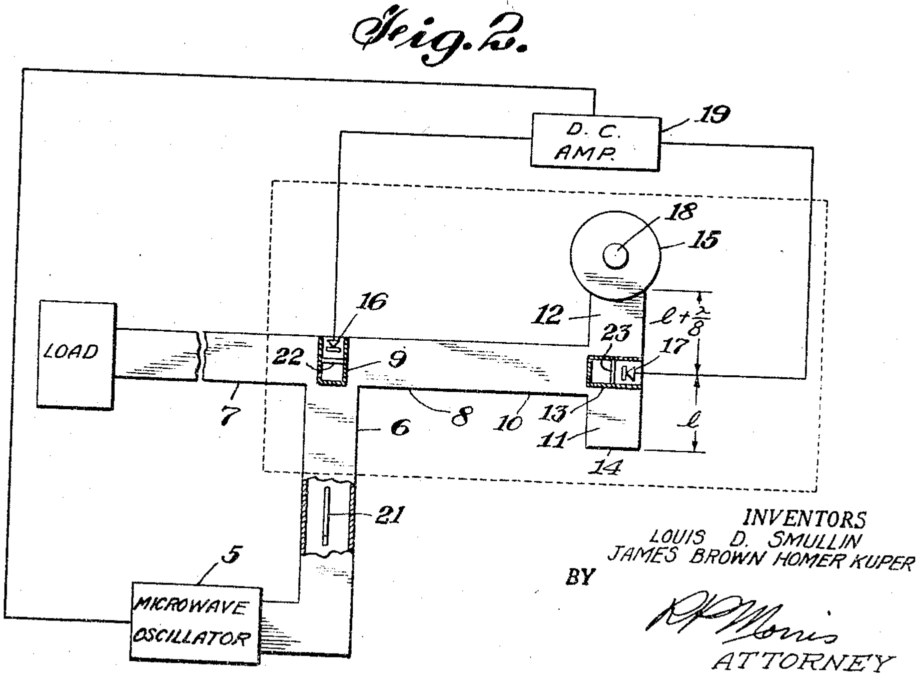
Fig. 2 is an equivalent schematic circuit diagram of the system of Fig. 1.

We have found both by experiment and mathematical analysis, that reflections from the crystals 16, 17 are of great importance in giving rise to such abnormal discriminator curves, and most particularly in upsetting the expected two-to-one ratio between the powers incident on the crystals when the cavity 15 is detuned. Unless this two-to-one ratio is known, it becomes difficult to make the adjustments to insure that oscillator 5 is correctly stabilized and that it is operating at the center of the range over which stabilization can be expected. To minimize, and in certain cases to eliminate, these difficulties, according to the invention there are interposed between the crystals 16, 17 and their respective "T" junctions, suitable wave attenuator or resistor pads 22, 23. These pads can be of any well-known design and may take the form of tapered cards such as shown in Figs. 1 and 2 and are located respectively within the arms 9 and 13 in front of detectors 16, 17, and should be of such a resistance at the operating frequencies that the loss is great enough to reduce the reflection from any crystal selected at random to a negligible value, for example to a standing wave voltage ratio of approximately 1.2 and not substantially above 1.8. The loss required in the arm 9 (which normally receives only one-half the power received by crystal 17) may, for example, be made three decibels less than that in arm 13, so that the off-resonance currents are approximately equal.

While we have described above the principles of our invention in connection with specific apparatus, it is to be clearly understood that this description is made only by way of example and not as a limitation to the scope of our invention.

What is claimed is:

1. A microwave oscillator frequency stabilization arrangement, comprising a first "Magic T" junction, a second "Magic T" junction, each junction having an input arm, a pair of lateral arms and an arm opposite to the input arm, a crystal detector in each of said opposite arms, a direct current amplifier for amplifying the difference between the crystal outputs, an oscillator to be stabilized and coupled to the input arm of the first "Magic T," one of the lateral arms of the first "Magic T" being coupled to a load circuit, and the other lateral arm of the first "Magic T" being coupled to the input arm of the second "Magic T," one lateral arm of the second "Magic T" being terminated in a tunable resonant cavity and the other lateral arm of the second "Magic T" being terminated in a short circuit, and means for reducing the wave reflections from each of said detectors comprising an attenuator pad adjacent to and in front of each detector arranged for reducing the wave reflection therefrom.

2. A microwave oscillator frequency stabilization arrangement according to claim 1 in which the said attenuator pads reduce the reflection from each crystal to a standing wave voltage ratio of between 1.2 and 1.8.

3. A microwave frequency stabilization arrangement according to claim 1 in which said cavity is tuned to the desired stabilized frequency of the oscillator.

LOUIS D. SMULLIN.
JAMES BROWN HOMER KUPER.

REFERENCES CITED

The following references are of record in the file of this patent:

UNITED STATES PATENTS

| Number | Name | Date |
|---|---|---|
| 2,423,526 | Sontheimer et al. | July 8, 1947 |

OTHER REFERENCES

Recent Developments in Frequency Stabilization of Microwave Oscillators, Tuller, Galloway and Zaffarano, Proc. of I. R. E., June 1948, pages 794–800.

Frequency Stabilization of Microwave Oscillators, Pound, Proc. of I. R. E., December 1947, pages 1405–1415.